United States Patent
Ito et al.

(10) Patent No.: US 9,318,157 B2
(45) Date of Patent: *Apr. 19, 2016

(54) STACKED DEVICE DETECTION AND IDENTIFICATION

(71) Applicant: Micron Technology, Inc., Boise, ID (US)

(72) Inventors: Yutaka Ito, Hachioji (JP); Keiichiro Abe, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/668,667

(22) Filed: Mar. 25, 2015

(65) Prior Publication Data

US 2015/0199997 A1    Jul. 16, 2015

Related U.S. Application Data

(63) Continuation of application No. 12/641,520, filed on Dec. 18, 2009, now Pat. No. 8,996,836.

(51) Int. Cl.
| | |
|---|---|
| G06F 13/00 | (2006.01) |
| G11C 5/04 | (2006.01) |
| G11C 7/20 | (2006.01) |
| H01L 25/065 | (2006.01) |
| H03K 5/153 | (2006.01) |

(52) U.S. Cl.
CPC .. *G11C 5/04* (2013.01); *G11C 7/20* (2013.01); *H01L 25/0657* (2013.01); *H03K 5/153* (2013.01); *H01L 2225/06541* (2013.01); *H01L 2924/0002* (2013.01)

(58) Field of Classification Search
None
See application file for complete search history.

(56) References Cited

U.S. PATENT DOCUMENTS

| | | |
|---|---|---|
| 5,619,134 A | 4/1997 | Watanabe et al. |
| 7,346,051 B2 | 3/2008 | Nakayama et al. |
| 7,494,846 B2 | 2/2009 | Hsu et al. |
| 7,650,481 B2 | 1/2010 | Walker |
| 7,816,934 B2 | 10/2010 | Keeth |
| 7,894,229 B2 | 2/2011 | Lahtinen et al. |
| 8,032,804 B2 | 10/2011 | Jeddeloh |
| 8,996,836 B2 | 3/2015 | Ito et al. |
| 2005/0082664 A1 | 4/2005 | Funaba et al. |
| 2007/0126105 A1 | 6/2007 | Yamada |
| 2011/0148469 A1 | 6/2011 | Ito et al. |

*Primary Examiner* — Idriss N Alrobaye
*Assistant Examiner* — Richard B Franklin
(74) *Attorney, Agent, or Firm* — Schwegman Lundberg & Woessner, P.A.

(57) ABSTRACT

Various embodiments include apparatus and methods having circuitry to detect and/or assign identification information to dice arranged in a stack and coupled by conductive paths.

19 Claims, 12 Drawing Sheets

STACKED DEVICE DETECTION AND IDENTIFICATION

PRIORITY APPLICATION

This application is a continuation of U.S. application Ser. No. 12/641,520, filed Dec. 18, 2009, which is incorporated herein by reference in its entirety.

BACKGROUND

Computers and other electronic products, e.g., televisions, digital cameras, and cellular phones, often use memory devices to store data and other information. In order to increase the amount of memory provided in a limited space, some memory devices may have multiple semiconductor dice arranged in a stack (e.g., a vertical arrangement). A stack of memory may include an interface die to provide input/output functionality with other components, and one or more additional memory die connected to and stacked along with the interface die. Electrical connection through a memory die substrate may be provided by conductive vias that penetrate the substrate, such as from one surface of a memory die substrate to another surface. When silicon technology is used, these vias may be referred to as through silicon vias (TSV). Individual dice in a memory stack may be associated with identification (ID) information.

DETAILED DESCRIPTION

In many embodiments, dice in a memory stack are associated with identification (ID) information, which can be used to enhance communication, organization, and configuration of various elements. When various forms of ID information communication are coupled with the selective use of TSVs, enhanced stack device performance, and or reduced stack circuit area, may result.

Various embodiments of the invention will thus be described below with reference to the accompanying figures. In many embodiments, an apparatus arranged in a dice stack is described. In an example embodiment, the device may comprise a stacked memory device such as dynamic random access memory (DRAM), double-data-rate three synchronous dynamic random access memory (DDR3-SDRAM), or the like. FIGS. 1 through 10 describe example embodiments of apparatus and methods for detecting die in the stack during an initialization period, with the interface die in the stack counting the number of other dice in the stack, for example. In some embodiments, apparatus and methods for determining a number of dice in the stack at an interface die are described. FIG. 11 describes an example embodiment of a system utilizing the apparatus and methods of FIGS. 1 through 10.

Figure 1:
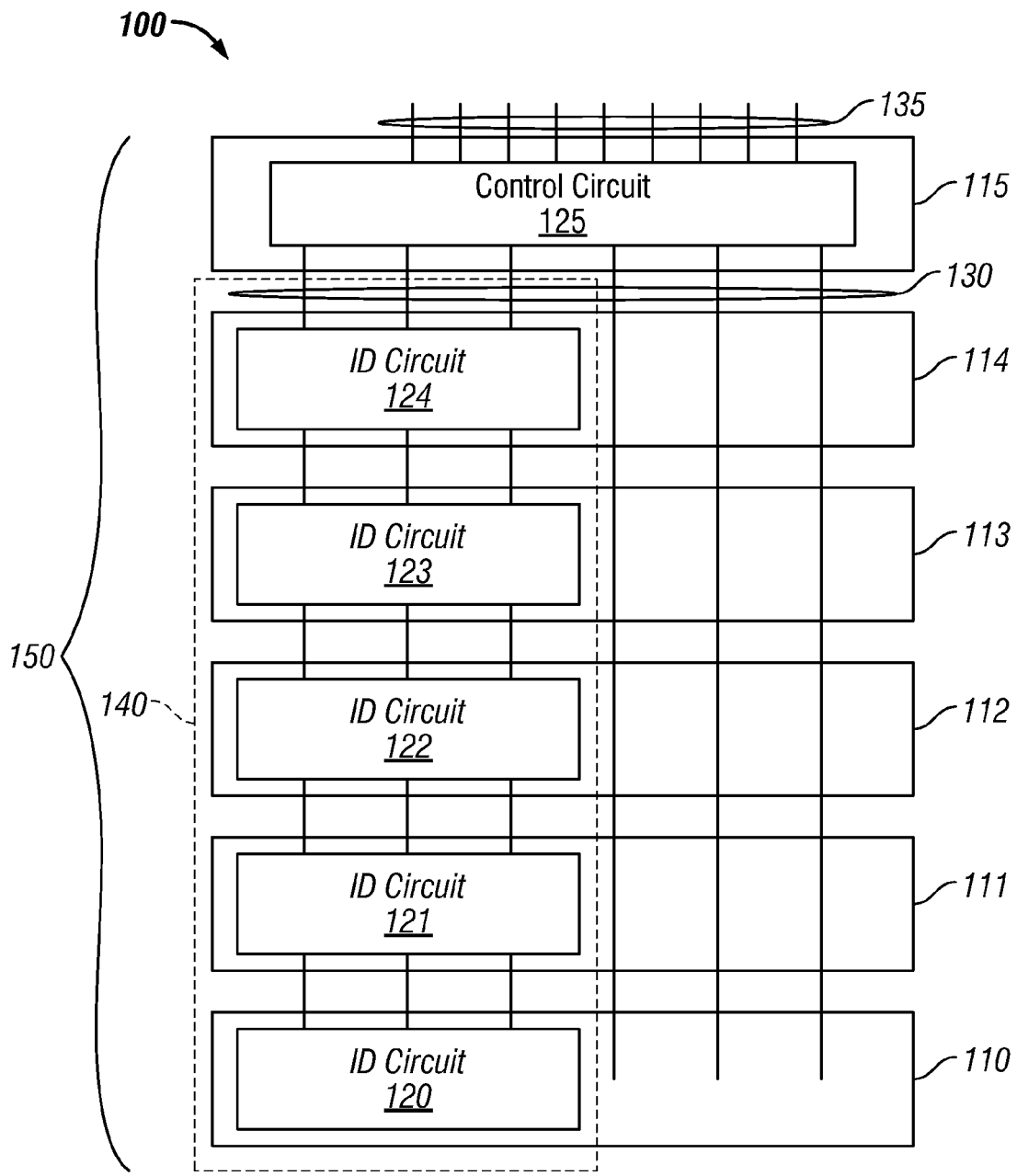
FIG. 1 illustrates a block diagram of an apparatus including dice physically arranged in a stack according to an example embodiment.

FIG. 1 illustrates a block diagram of an apparatus 100 including dice 110, 111, 112, 113, 114, and 115 physically arranged in a stack 150 (e.g., forming a stacked memory device) according to an example embodiment. Stack 150 may form a memory device in which dice 110 through 115 are coupled to and communicate with each other by one or more conductive paths 130, in accordance with an embodiment of the invention. Dice 110 through 115 communicate with other devices external to the dice stack 150 through one or more conductive paths 135 extending from an interface die (e.g., die 115). The conductive paths 130 and 135 may transfer information such as data, address, control, ID information, among other information. In an embodiment, apparatus 100 may be communicatively coupled with external devices, e.g., processors and memory controllers, through the interface die, e.g., die 115, and apparatus 100 may be included in electronic devices, e.g., a computer, a television, a digital camera, a cellular phone. FIG. 1 shows conductive paths 130 and 135 with a specific number of paths and stack 150 with a specific number of dice 110 through 115 as an example. The number of conductive paths 130, 135 and dice in stack 150 may vary.

Dice 110, 111, 112, 113, 114, and 115 may each be associated with different ID information to, for example, recognize and distinguish each die from the other dice in the stack 150, and for identification of and communication with each die. In some embodiments, the dice 110, 111, 112, 113, 114, and/or 115 may be assigned ID information during the manufacturing process. In an example embodiment, the apparatus 100 may detect and determine (e.g., assign) ID information to some or all of the dice during an initialization period of the apparatus 100. The initialization process may be performed when apparatus 100 is powered on (e.g., whether from a full power-off or as a reset), at which time detection and ID information assignment for dice in the stack 150 may commence.

As shown in FIG. 1, each of the dice 110, 111, 112, 113, and 114 includes a corresponding ID circuit 120, 121, 122, 123, 124, respectively, and interface die 115 include a control circuit 125. ID circuits 120 through 124 and control circuit 125 include logic circuitry and other components to control communication to and from dice 110, 111, 112, 113, 114 and 115. In an embodiment, the control circuit 125 of interface die 115 may detect die during an initialization period that begins after apparatus 100 is powered on (e.g., after the point in time when operational power is supplied to the apparatus 100, whether coming out of a full power-off or just a reset). In an embodiment, the ID circuits 120, 121, 122, 123, 124 may be configured to assign ID information during initialization of the stack 150, and may retain the assigned ID information after the initialization of stack 150, such as in order for control circuit 125 to reference each die 110 through 115 by the ID information. For clarity, FIG. 1 omits the logic and circuit elements of ID circuits 120, 121, 122, 123, 124, and 125. It should be noted that these elements may include transistors, select elements and other circuit elements with functions that are similar or identical to those of the apparatus shown in FIG. 4A and FIG. 8A.

In an example embodiment, control circuit 125 may operate to detect each die 110 through 115 in stack 150 in succession, in either top-down or bottom-up directions via one or more conductive paths 130. In the example embodiment, the ID information for each die 110 through 115 in the stack 150 may permit control circuit 125 to automatically change memory configurations to optimize storage, access one or more memory arrays individually, and/or to adjust configuration for delays of the internal bus, among other implementations.

Figure 2:
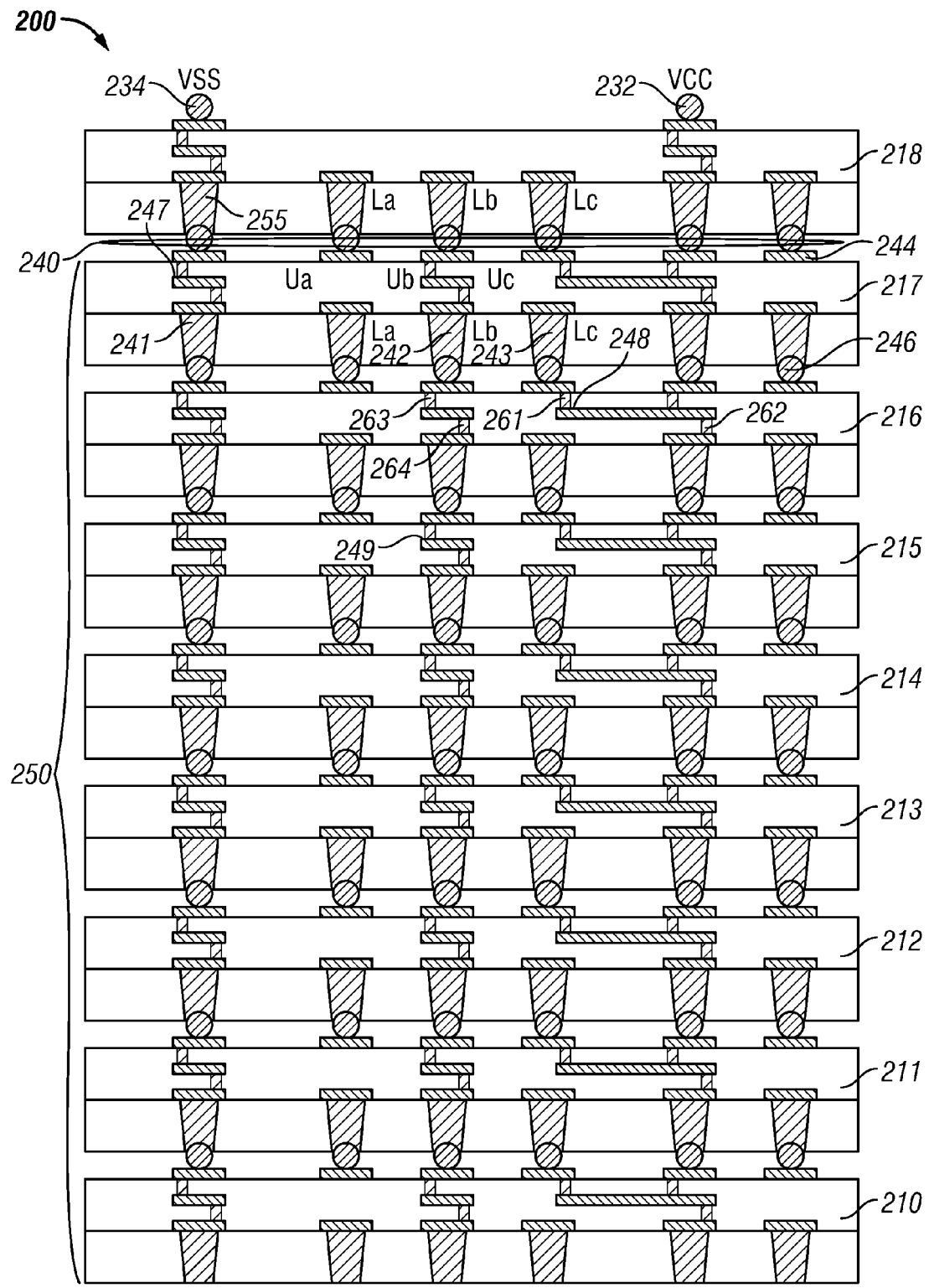
FIG. 2 illustrates a cross-sectional view of an apparatus including a stack of dice according to an example embodiment.

FIG. 2 illustrates a schematic diagram of a cross sectional view of an apparatus 200 including stack 250 of dice 210 through 218 according to an example embodiment. Dice 210 through 217 of stack 250 may comprise memory arrays and die 218 may comprise an interface die with the external contacts 232 and 234 to enable apparatus 200 to communicate with other devices, such as a processor or memory controller.

Apparatus 200 comprises conductive paths 240 which may include a combination of conductive vias 241, 242, and 243, pads 244, and joints 246. The vias 241, 242, and 243 may be connectively coupled to circuitry 247, 248 and 249, illustrated and described in greater detail with reference to FIGS. 3 and 4A below. As mentioned above, the stack 250 may include fewer or greater number of dice and conductive paths.

FIG. 2 depicts conductive paths 240 with vias 241, 242, and 243 extending at least partly through die. Some conductive paths 240 may extend the entire height of stack 250. The circuitry 247, 248, and 249 of apparatus 200 may include conductive portions 261, 262, 263, 264 and 265 as shown, for example, with dice 216 and 217. Conductive portions 261, 262, and 263 may conductively couple various components (e.g., a pad 244 and via 244) of a conductive path(s) to die circuitry 247, 248, and 249. Die circuitry 247, 248 and 249 can include ID circuitry used to detect and/or assign ID information to each die in the stack.

Apparatus 200 may form a memory device having circuit components such as memory cells, decode circuits, control circuits, and other components. Apparatus 200 may include circuitry in addition to circuitry 247, 248, and 249; these additional components are omitted from FIG. 2 so as not to obscure the embodiments described herein. Interface die 218 may include additional circuitry, e.g., buffers, and I/O drivers, to accommodate the transfer of information at appropriate data transfer rates between apparatus 200 and another device, such as processors or a memory controller.

The apparatus 200 may also form part of an integrated circuit (IC) chip, such as when dice 210 through 218 are fabricated inside an IC chip. During initialization of the stack 250, which may occur when a device powers on (whether after a full power-off or as part of a reset), the control circuit of the stack (e.g., circuitry of interface die 218) may operate to detect each die 210, 211, 212, 213, 214, 215, 216, 217, and 218 in the stack 250, and determine a number of dice in stack 250 at interface die 218 and retain the determined stack dice number information at the interface die.

Figure 3:
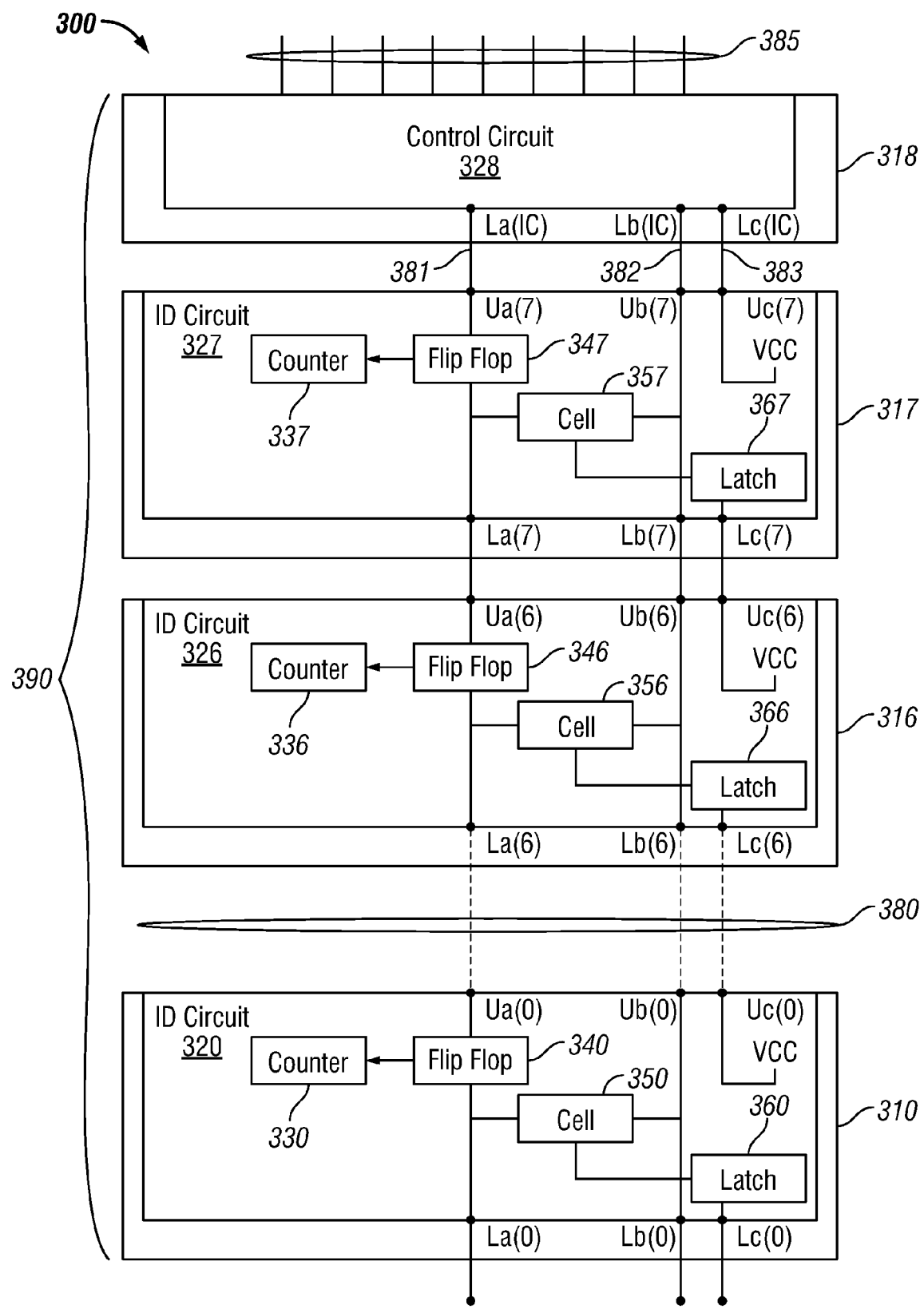
FIG. 3 illustrates a block diagram of an apparatus with dice arranged in a stack illustrating components of each dice according to an example embodiment.

FIG. 3 illustrates a block diagram of an apparatus 300 with dice 310 through 318 arranged in a stack 390 illustrating components of each die 310 through 318 according to an example embodiment. In stack 390, die 318 comprises an interface die formed at least partially by control circuit 328, and each die 310 through 317 is formed at least partially with ID circuits 320 through 327, respectively. Each die 310 through 317 is connected to interface die 318 at control circuit 328 by conductive paths 380, with conductive paths 381 and 382 connecting through the stack 390 extending from the control circuit 328. Conductive paths 381, 382, and 383 connect interface die 318 with die 317, die 317 with die 316, and so on, permitting interface die 318 to communicate with each die in the stack 390 independently, or collectively. Conductive path 383 provides power to each ID circuit 320 through 327. The conductive paths 381 through 383 may comprise TSVs or other conductive mechanisms forming through vias in the dice. Although depicted with conductive paths 381, 382, and 383, apparatus 300 may include fewer or greater number of conductive paths. The dashed conductive path lines 380 between die 310 and die 316 symbolically indicate that additional dice or fewer dice may be connected in a similar manner between die 310 and 316 in stack 390.

The lower node of the control circuit 328 of interface die 318 conductive path 381, designated La(IC), is communicatively coupled with the upper node of die 317 of conductive path 381, designated Ua(7). The lower node of control circuit 328 of interface die 318 of conductive path 382, designated Lb(IC), is communicatively coupled with the upper node of die 317 of conductive path 382, designated Ub(7). The lower node of control circuit 328 of interface die 318 of conductive path 383, designated Lc(IC), is communicatively coupled with the upper node of die 317 of conductive path 383, designated Uc(7). Each die is coupled to an adjacent die in a similar manner. For example, the lower node La(7) of die 317 is communicatively coupled to the upper node Ua(6) of die 316; the lower node Lb(7) of die 317 is communicatively coupled to the upper node Ub(6); The lower node Lc(7) of die 317 is communicatively coupled to the upper node Uc(6), and so on.

Each die 310 through 317 of the stack 390 includes an ID circuit 320 through 327, respectively, with a variety of circuitry components. As will be described further with respect to FIG. 4A, control circuit 328 may comprise similar circuitry (but not necessarily the exact same circuitry) as ID circuits 320 through 327. Circuit 327 of die 317 includes a counter 337, a flip flop 347, a cell 357, and a latch 367. As depicted in FIG. 3, conductive path 381 is communicatively coupled to flip flop 347, and flip flop 347 is communicatively coupled to counter 337. Cell 357 is communicatively coupled with conductive paths 381 and 382, and also communicatively coupled to flip flop 347 and latch 367.

Die 317 is communicatively coupled with die 316 by conductive paths 381, 382, and 383. Flip flop 347 of 317 is communicatively coupled to flip flop 346 of die 316 by conductive path 381. Cell 357 of die 317 is communicatively coupled to cell 356 of die 316 by conductive paths 381 and 382. Conductive path 383 provides power Vcc to each die. Each die may be communicatively coupled to an adjacent die in a similar manner.

In an embodiment, cells 350 through 357 comprise bypass transistors (e.g., p-type metal oxide semiconductor (pMOS) transistors) which form the "rungs" of a conductive "ladder" configuration between conductive paths 381 and 382, the ladder being used to selectively connect conductive path 381 with conductive path 382 in stack 390. Cells 350 through 357 can each be used to form a scan loop with flip flops 340 through 347, depending upon where the respective die 310 through 317 is arranged in the stack. Flip flops 340 through 347 are connected along conductive path 381 to form a shift register through stack 390. Again, depending upon where the respective die is arranged in the stack, each cell 350 through 357 may operate to selectively allow feedback from its respective flip flop 340 through 347. The gates of cells 350 through 357 (e.g., formed using bypass transistors) are controlled by corresponding latches 360 through 367. The latches 360 through 366, for example, may be first fixed to a high output, disabling cells 350 through 356, while the latch 367 may be fixed to a low output, such that cell 357 can be selectively enabled (e.g., depending on the state of a RSTB signal).

In an example embodiment, during an initialization period of the stack 390, the ID circuits 320 through 327 may operate to receive clock pulses. The vertical shift register, constructed of flip flops 340 through 347 of stack 390, activates each flip flop 340 through 347 in succession—beginning with flip flop 347 of die 317, and each die thereafter. Each respective ID circuit 320 through 327 begins "counting" the falling edge of each clock pulse at each counter 330 through 337, beginning with counter 337. Each counter 330 through 337 begins counting upon activation of corresponding flip flop 340 through 347 as data is shifted through the vertical shift register. For example, flip flop 347 is activated first, then flip flop 346 activated second (upon the falling edge of next clock pulse), and so on.

As the arrangement of stack 390 leads to cell 350 forming a feedback scan-loop from conductive path 381 to 382, activation of the last flip-flop 340 in stack 390 is detected by the control circuit 328 of die 318, terminating the initialization period and clock signal production. With the clock signal production terminated, corresponding counters 320 through 327 are stopped at the incremented counter value of each respective counter 330 through 337.

Control circuit 328 operates to detect the number of shift operations of the shift register formed by flip flops 340 through 348 and to determine a number of dice in stack 390. In an example embodiment, control circuit 328 includes a flip flop and a counter to count clock pulses (in a manner similar to that of other dice in the stack 390) while ID information is assigned to each die 310 through 317 of stack 390.

Counter 337 may operate to dynamically update ID information during an initialization period of stack 390. For example, counter 337 may increment or decrement the ID information for die 327 in relation to its position within the stack 390 until the initialization period has concluded. Upon terminating the initialization period, the ID information is retained, assigning a unique ID to each die 310 through 318 detected in the stack 390.

Figure 4A:
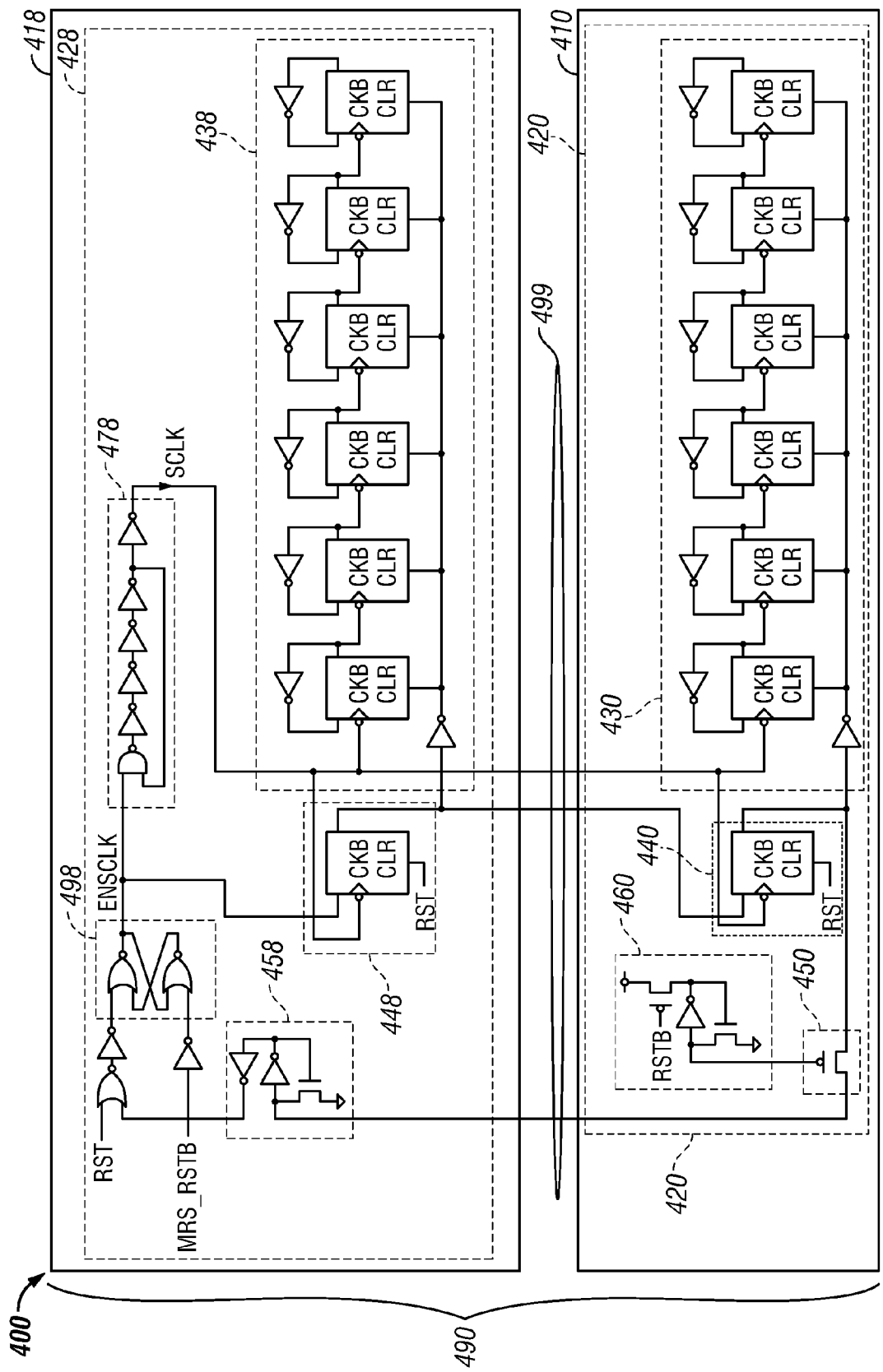
FIG. 4A illustrates a circuit diagram of an apparatus depicting the control circuit of interface die coupled to an ID circuit of a die according to an example embodiment.

FIG. 4A illustrates a circuit diagram of an apparatus 400 depicting the control circuit 428 of the interface die 418, coupled to an ID circuit 420 of die 410, according to an example embodiment. Control circuit 428 includes counter 438, latch 498, flip flop 448, oscillator 478, and termination circuit 458. ID circuit 420 of die 410 includes counter 430, flip flop 440, and latch 460. Conductive paths 499 are depicted as dashed lines between die 410 and interface die 418 to indicate the potential presence of a plurality of additional dice similar to die 410, which may be connected and communicatively coupled between dice 410 and 418 in stack 490 in a manner similar to that which is depicted with respect to dice 410 and 418.

As illustrated in FIG. 4A, latch 498 of control circuit 428 is coupled to oscillator 478 and flip flop 448. Oscillator 478 is coupled to flip flop 448 and counter 438. In an example embodiment, counter 438 of control circuit 428 is coupled to counter 430 of ID circuit 420. In the example embodiment, flip flop 448 of the control circuit 428 of the interface die 418 is coupled to the flip flop 440 of ID circuit 420 of die 410. Latch 460 of ID circuit 420 is coupled to cell 450 to allow selective communication between ID circuit 420 and termination circuit 458 of the control circuit 428.

Counters 430 and 438 are constructed from a plurality of flip flops. In some embodiments, the number and form of flip flops for constructing counters 430 through 438 may depend on the number of dice that might be used in a stack 490 that includes die 410 or other conditions surrounding the implementation of the apparatus 400. In an example embodiment, the flip flops of counters 430 through 438 may comprise D-type flip flops. Flip flops 440 through 448 may also comprise D-type flip flops. The number and form of flip flops for constructing counters 430 and 438 may vary.

Figure 4B:
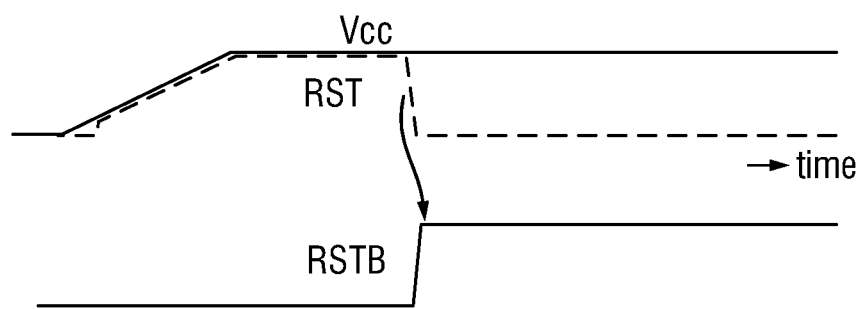
FIG. 4B illustrates a timing diagram of input signals during an initialization period, in accordance with an example embodiment.

FIG. 4B illustrates a timing diagram 400B of input signal RST and RSTB during an initialization period, in accordance with an example embodiment. In an example embodiment, during a powering on of the device, the RST signal starts from a low signal and gradually increases to a high in accordance with Vcc and the RSTB signal is set to low. The RST and RSTB signals are then both inverted at some point in time.

Figure 4C:
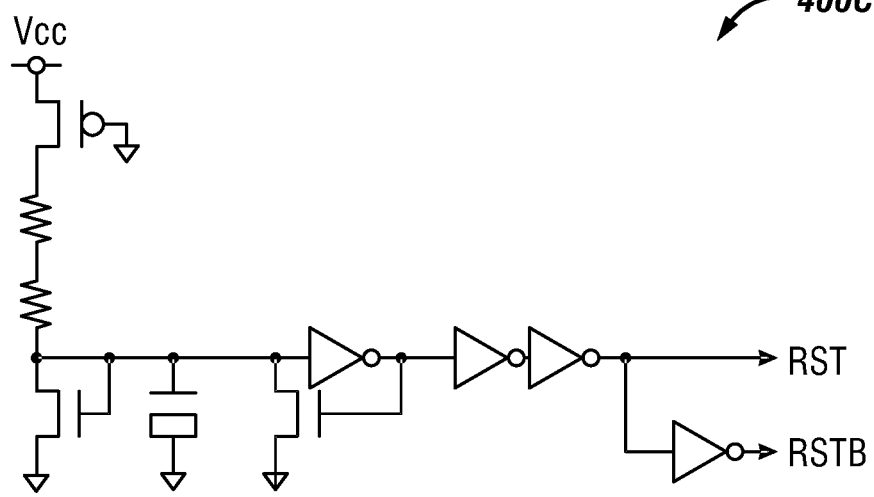
FIG. 4C illustrates a power on reset circuit, in accordance with an example embodiment.

FIG. 4C illustrates a power on reset circuit 400C, in accordance with an example embodiment. The power on reset circuit 400C is used for powering on the stack device. In other example embodiments, the power on reset circuit 400C may be modified, in a configuration in accordance with parameters of the device. In some embodiments, the power on circuit may be included within the interface die.

Figure 5:
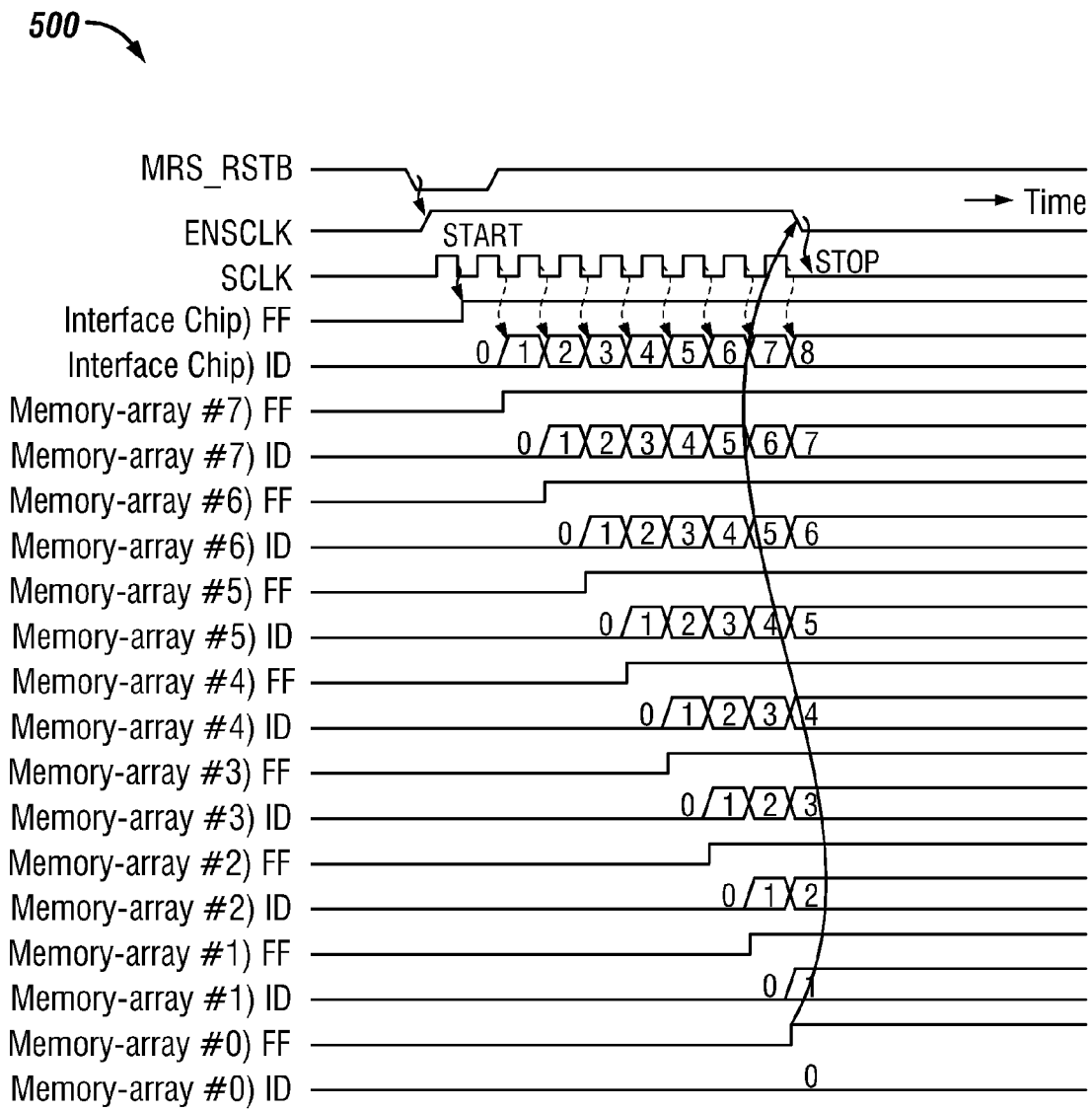
FIG. 5 illustrates a timing diagram for dice detection and ID assignment during an initialization period of the apparatus illustrated in FIGS. 3 and 4A according to an example embodiment.

FIG. 5 illustrates a timing diagram 500 for dice detection and ID assignment during an initialization period of the apparatus 300 and 400 illustrated in FIGS. 3 and 4A according to an example embodiment.

With reference to FIG. 5 and as depicted in FIG. 4A, the signal MRS_RSTB indicates a reset bar signal generated by the Mode Register Set command (MRS), which sets the mode of the stack. The mode may be set, for example, as an initialization mode for detection of and/or assignment of ID information to dice in the stack. RST (Reset) is set to high and MRS_RSTB is set to low during the power on cycle. Upon power on, RST and MRS_RSTTB are inverted. The signal ENSCLK refers to the activation signal of oscillator 478 of FIG. 4A and is received by flip flop 448 when latch 498 receives an activation signal from the signal of RST and MRS_RSTB to commence initialization of stack 490. Oscillator 478 commences generating a square wave oscillation signal SCLK upon receiving the activation signal ENSCLK produced by latch 498. Counter 438 receives signal SCLK from the oscillator 478 which initiates a dice count of all the dice in stack 490 at the interface die 418. At the falling edge of the SCLK, the flip flop 448 is activated, and with each additional falling edge of SCLK, counter 438 increments (or, in other embodiments, decrements) to count a number of dice in the stack 490 until a termination signal is generated by termination circuit 458, which can be responsive to a signal generated in the last die in the stack 490.

During an initialization (e.g., power-on), the latch (e.g., latch 460) of the bottom die is low, but all other latches are initially high. All flip flops 440 through 447 for each ID circuits 420 through 427 are reset or cleared with RST input during power-on. Cell 450 is the only cell of the stack that is enabled with low output of the bottom die latch. All other cells (451 through 457) are disabled with a high output of the other dies and latches. This allows for a scan loop construction and upon reaching the last die both ENSCLK and SCLK become disabled. In another example embodiment, all latches and cells may become disabled through the scan loop as a safety design.

In an example embodiment, during the initialization period, each detected die (e.g., 417, 416 etc., not shown in FIG. 4A) of stack 490 begins incrementing their respective counters (e.g., 437, 436, etc., not shown in FIG. 4A) with each successive clock pulse as shown in FIG. 5. Each counter circuit is enabled with the output of the each flip flop of the die. For example, counter 437 of die 417 (not shown in FIG. 4A) increments by one during the initialization period for each received clock pulse at flip flop 447 (not shown in FIG. 4A). Then, on the next falling edge of the clock pulse, the next flip flop 446 (also not shown in FIG. 4) begins incrementing the counter 436 of die 416, and so on. Each subsequent ID circuit of each die in the stack performs a similar series of operations. At the interface die, the flip flop signal as show in FIG. 5 provides an output to flip flop 448 and the count is retained in counter 438 of FIG. 4A, flip flop memory array die #7 FF provides an output to flip flop 447 in FIG. 4A and the count is retained in counter 438, and so on.

Interface die 418 generates a termination signal responsive to activation of the last flip flop (e.g., 440) of the last die (e.g., die 410) in stack 490. For example, in FIG. 4A the termination circuit 458 of interface die 418 receives a scan loop signal (since the latch 460 is fixed to enable the respective cell 450 (e.g., bypass transistor)) responsive to activation of the last flip flop 440. All latches and cells are fixed to a low or high level after a power-on cycle and that state does not change even after counting. The scan loop signal is received by the interface die 418 from the last die 410, since the bottom dies cell 450 is enabled with an output of the bottom latch 460. Therefore, as depicted in FIG. 5 and with reference to FIG. 4A, the last die, e.g. die 410, is assigned a stack ID information of 0 since counter 430 does not increment before the scan loop signal is received by termination circuit 458, which signals latch 498 to terminate the initialization period and clock signal production at oscillator 478.

With reference to the timing diagram of FIG. 5, and as depicted in FIG. 3, when flip flop 347 receives an activation signal from the flip flop of the adjacent die along conductive path 381, in this case a flip flop in the interface circuit 328 (not shown in FIG. 3), at the falling edge of the next CSLK clock pulse, flip flop 347 is activated. Upon receiving the next clock pulse of the clock CSLK, counter 337 commences assignment of the ID information for die 317. Accordingly, flip flop 346 is activated upon receiving a clock pulse SCLK, and the output pulse of flip flop 347, and so on. With latch 360 enabling cell 350 (given the arrangement of die 310 in stack 390 and an active low RSTB signal responsive to power-on), activating the flip flop of the final die (e.g., flip flop 340 of die 310), activates a termination circuit (not shown in FIG. 3) of control circuit 328. Therefore, the die 310 is assigned a stack ID information value of "0" since counter 330 does not increment before the termination circuit (not shown in FIG. 3) of the control circuit 428 terminates the initialization period.

As shown in FIG. 5 and described above in the preceding sentence, in an example embodiment, the counter of the last die 310 in the stack 390 does not increment. Therefore the assigned ID information value for the last die 310 is "0". The counter of the adjacent die in the stack 390 incremented to "1", and therefore the assigned ID information value for the second to last die in the stack is "1", and so on. In an example embodiment, as depicted in FIG. 3, when there are 8A dice 310-317 in stack 390 (not including the interface die 318), the counter (not shown) of control circuit 328 increments to 8, which indicates the number of other dice in the stack 390.

Continuing with an embodiment where there are 8 dice 310-317 (not including interface die 318) in the stack 390, counter 337 of die 317 increments to a value of seven and therefore the ID information value assigned to die 317 is "7". Similarly, as depicted in FIG. 4A, when there are eight dice in stack 490 (other than interface die 418), counter 438 of control circuit 428 increments to a value of 8, which indicates a number of dice 410-417 in the stack 490 (other than interface die 418). In an embodiment, counter 430 of die 410 does not increment and therefore die 410 is assigned a value of "0" as ID information. Each successive die in the stack (not shown) increments its respective counter by one to assign ID information to the respective die. For example, a die 411 (not shown in FIG. 4A) is assigned an ID information value of "1" when the counter for die 411 increments to one, die 412 (not shown in FIG. 4A) is assigned ID information value of "2" when the counter for die 412 increments to two, and so on.

In another example embodiment, if apparatus 400 has only two dice in stack 490 (including interface die 418), then counter 438 of the control circuit 428 increments to one, which indicates that there is one non-interface die 410 in the stack 490. In this example, the ID information of die 410 is assigned a value of "0" since counter 430 does not increment during the initialization period. Thus the ID information assigned to the interface die 418 corresponds with the number of non-interface dice in the stack (e.g., dice 410 through 417).

Figure 6:
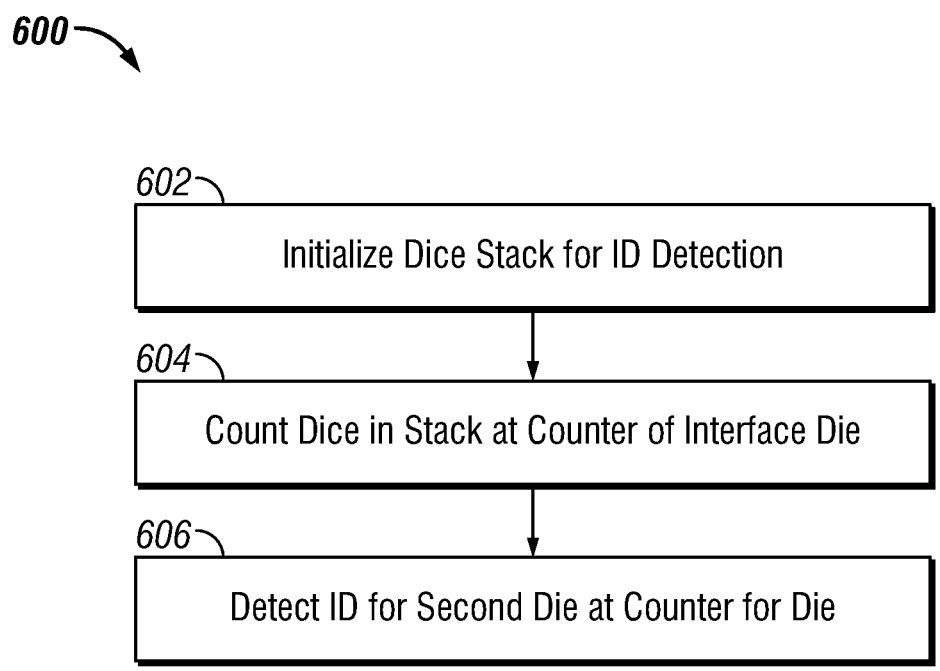
FIG. 6 illustrates a flow chart of a method of detecting and assigning ID information to dice in a stack according to an example embodiment.

FIG. 6 illustrates a flow chart of a method 600 of detecting and assigning ID information to dice in a stack according to an example embodiment. Method 600 may be used in apparatus such as apparatus 100 of FIG. 1, apparatus 200 of FIG. 2, apparatus 300 of FIG. 3, and apparatus 400 of FIG. 4A. Thus, the components of apparatus used in method 600 may include the components of apparatus 100, 200, 300, and/or 400 of FIGS. 1 through 4A respectively.

At block 602, method 600 may commence initialization of the dice stack for ID assignment and dice detection. In an example embodiment, the device may commence the initialization of the dice stack during an initial part of the power-on sequence for the device (e.g., commencing after operational power is applied to the device), wherein the device operates to signal the interface die to commence detection (e.g., detection of the number of dice in the stack) and ID assignment of the stack (e.g., assignment of ID information values to individual dice in the stack). At block 604, method 600 may begin by counting dice (e.g., other than the interface die) in the stack at the interface die. At block 606, the method 600 assigns the ID for each die (e.g., comprising one or more memory arrays) in the stack at the respective counter for each die in the stack. In an example embodiment, the method 600 may detect that the last die in the stack has been counted and in response, terminate counting operations at the interface die and at each die in the stack. Each die in the stack is thereby assigned the value it has counted as its ID information and the interface die retains the number of other dice in the stack. Method 600 may include other activities similar to or identical to the activities described above with reference to FIG. 1 through FIG. 5. In some example embodiments, method 600 may increment a counter forming part of the ID circuit to a value relative to a position of a corresponding one of the one or more dice in the stack.

Figure 7:
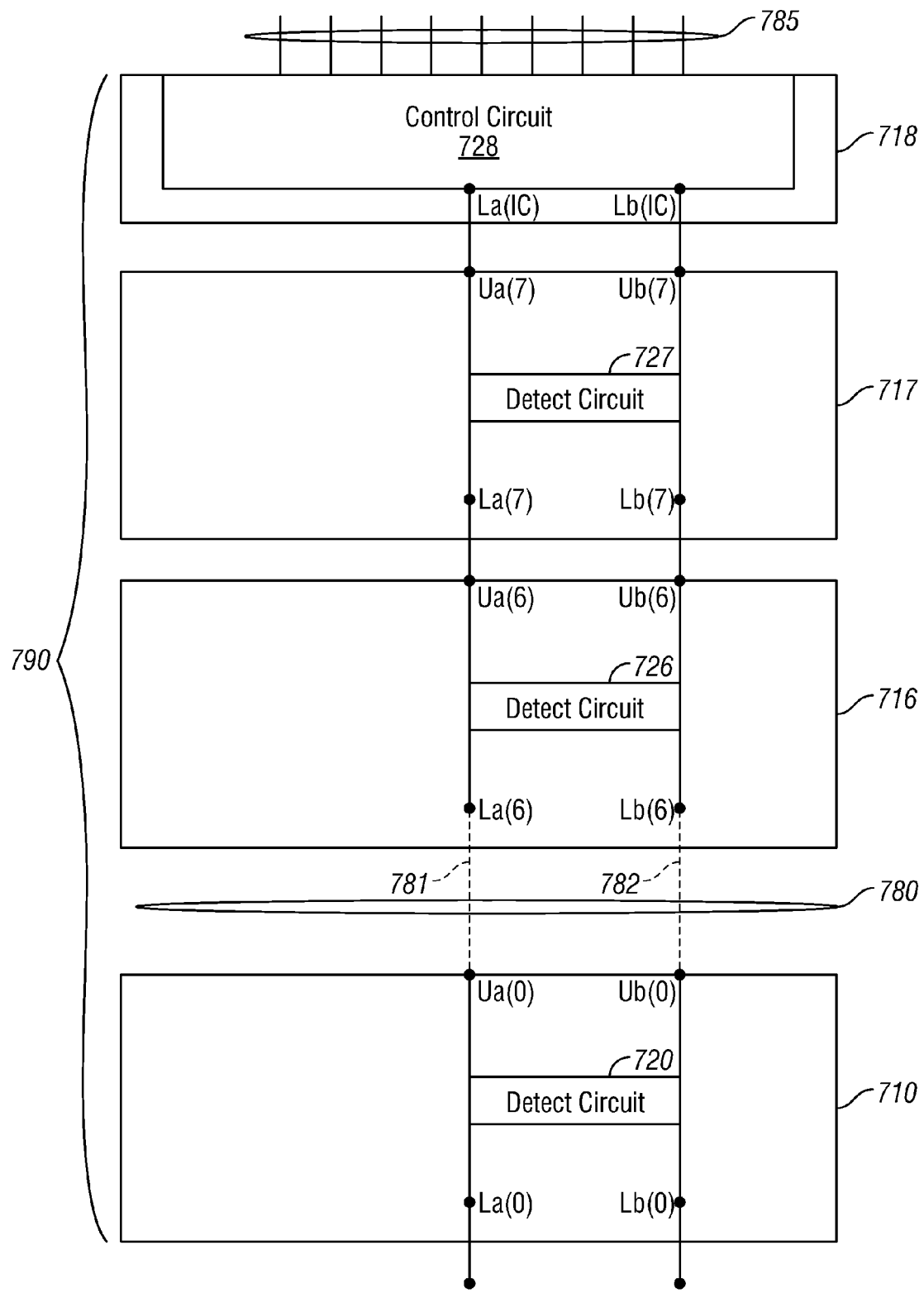
FIG. 7 illustrates a cross-sectional view of a block diagram of an apparatus comprising dice physically arranged in a stack according to an example embodiment.

FIG. 7 illustrates a cross-sectional view of a block diagram of an apparatus 700 comprising dice 710 through, 716, 717, and 718 physically arranged in a stack 790 according to an example embodiment. Stack 790 may form a memory device in which dice 710 through 718 are coupled to each other by conductive paths 780, communicating with external devices through conductive paths 785. As depicted in FIG. 7, die 718 is at least partially formed with a control circuit 728. Each additional die 710 through 717 in stack 790 includes a corresponding ID circuit 720 through 727 forming at least part of the die. In one or more embodiments, the control circuit 728 may detect the number of dice in the stack using the ID circuits of each die 710 through 717 in the stack. The detection of dice in the stack may be performed during an initialization period of the stack, perhaps initiated when the apparatus 700 is powered on.

The dashed lines between die 716 and die 710 indicate the potential presence of a plurality of additional dice similar to die 710, which may each be connected in a manner similar to the dice explicitly depicted in stack 790. Conductive paths 780 (e.g., paths 781 and 782) may conductively couple each ID circuit 720 through 727 with each other and also with control circuit 728. Conductive paths 785 may permit stack 790 to communicate with other devices such as processors and memory controllers through control circuit 728 of die 718.

Figure 8A:
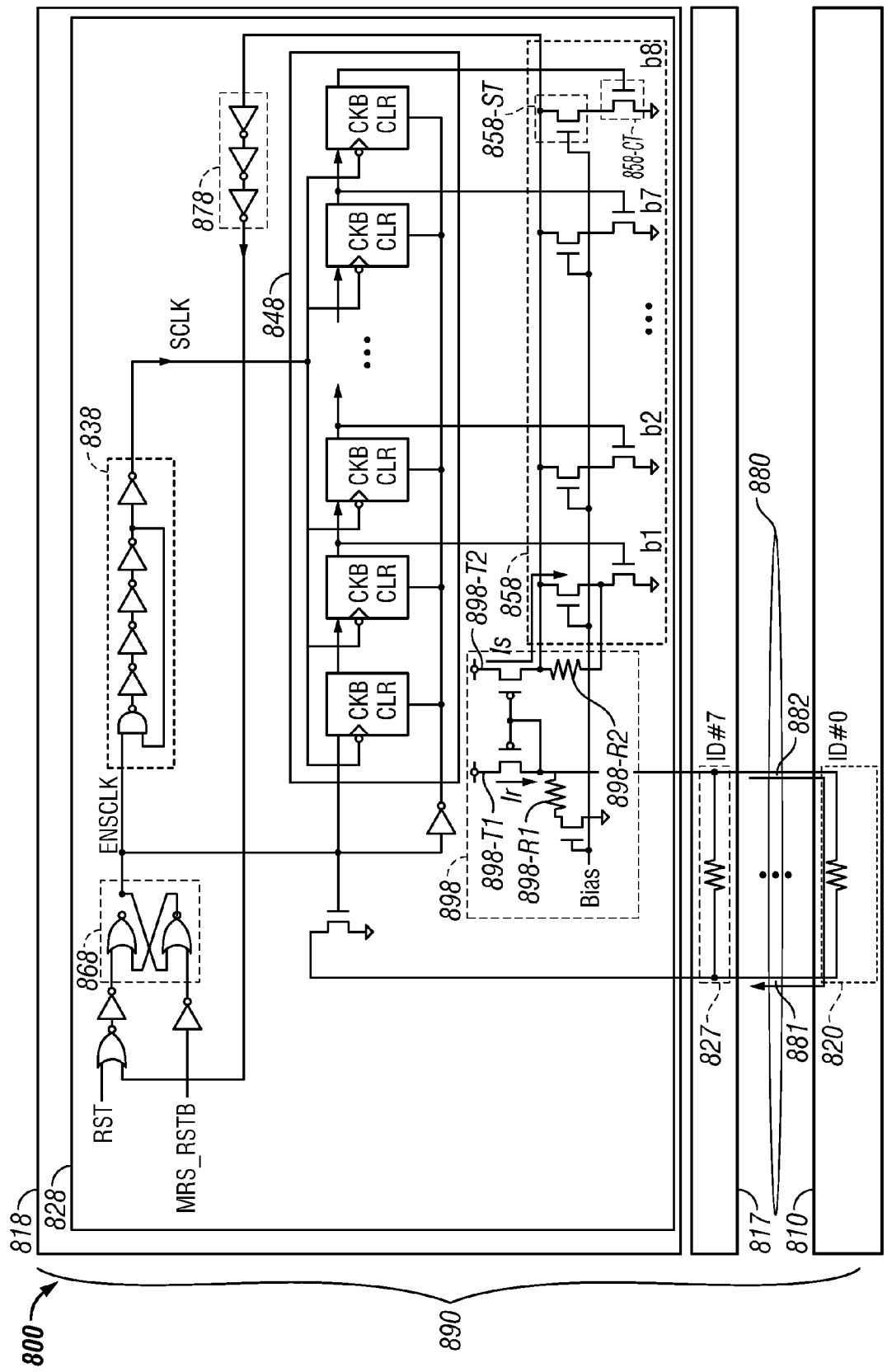
FIG. 8A illustrates a circuit diagram of an apparatus depicting circuitry of the interface die and ID circuits of a dice arranged in a stack according to an example embodiment.

FIG. 8A illustrates a circuit diagram of an apparatus 800 depicting circuitry of the interface die 818 and ID circuits 820 through 827 of dice 810 through 817 arranged in a stack 890 according to an example embodiment. FIG. 8A illustrates the circuitry of the ID circuits 727 through 720 and control circuit 728 of apparatus 700 shown in block diagram form in FIG. 7. A plurality of conductive paths 880 electrically couple the ID circuits 820 through 827 with control circuit 828. In an example embodiment, ID circuits 820 through 827 for each die 810 through 817 may include a resistor, the resistors having a substantially similar resistance for each die. Each resistor of ID circuits 820 through 827 may be coupled between conductive paths 881 and 882.

The components of control circuit 828 shown in FIG. 8A may comprise an oscillator 838, shift register 848, current monitor circuit 858, latch 868, termination circuit 878 and current comparison circuit 898. Latch 868 is coupled to oscillator 838, and through an inverter to each flip flop of shift register 848. Oscillator 838 is coupled to the input of each flip flop of shift register 848 and provides a clock pulse signal to shift register 848 (to be described in greater detail with respect to the timing diagram of FIG. 9). Shift register 848 includes a plurality of flip flop circuits arranged in series, and with the exception of the first flip flop in the series, all other flip flops of shift register 848 are coupled to a transistor of monitor circuit 858. Monitor circuit 858 includes pairs of transistors connected in parallel, at least some pairs of the transistors including a switch transistor 858-ST, and a current transistor 858-CT.

The switch transistor 858-ST is connected to a corresponding output of a flip flop of shift register 848. The switch transistor 858-ST is switched when the corresponding flip flop of shift register 848 is activated. By switching the switch transistor 858-ST, the current transistor 858-CT is also powered on to create a resistance comparable to the resistance of a respective one of the ID circuit of a die in stack 890.

Monitor circuit 858 is coupled to current comparison circuit 898. Current comparison circuit 898 operates to compare the monitor current (Is) across a current transistor 858-CT of monitor circuit 858 to a reference current (Ir), which is determined by the resistance of the ID circuits 827 through 820 of stack 890.

Current comparison circuit 898 includes a first transistor 898-T1, a second transistor 898-T2, a first resistor 898-R1, a second resistor 898-R2, and a bias voltage coupled to ID circuits 820 through 827 in stack 890. Current comparison circuit 898 operates to compare the reference current (Ir) at the first transistor 898-T1 to the monitor current (Is) at second transistor 898-T2 (in combination with activated transistors of monitor circuit 858). The first resistor 898-R1 is used to offset and decrease reference current (Ir) when comparing reference current (Ir) to monitor current (Is), and the second resistor 898-R2 is used to offset and increase monitor current (Is) when comparing to reference current (Ir). Generally, 898-R1 and 898-R2 are substantially the same value, but this is not necessarily the case.

The stack reference current (Ir) is determined by the resistance of ID circuits 820 through 827 in stack 890. Comparison circuit 898 also provides substantially the same bias voltage to the monitor circuit 858 as the comparison circuit 898. If monitor current (Is) is greater than or substantially equal to reference current (Ir), control circuit 828 terminates the initialization period (e.g., monitor circuit 858 activates termination circuit 878, which signals latch 868 to terminate clock signal production by the oscillator 838). Essentially, when control circuit 828 determines the value of current (Is) is greater than or substantially equal to the value of current (Ir), control circuit 828 detects the number of dice in stack 890. So when current (Is) is greater than current (Ir) with shift operation, the next stage inverter 878 issues a high level as "detect" signal. When the "detect" signal becomes high, the next latch 868 is cleared and ENSCLK signal is reset to a low level. Thus, the oscillator is stopped and the initialization period terminates.

Figure 8B:
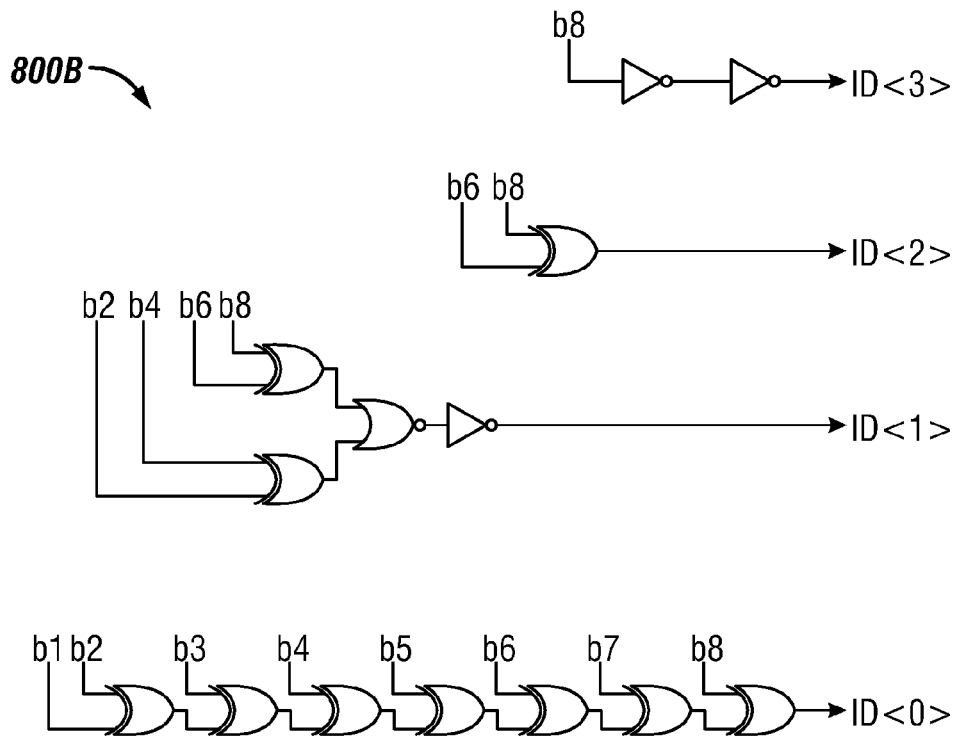
FIG. 8B depicts a decoder circuit of a dice in the stack in accordance with an example embodiment.

FIG. 8B depicts decoder circuits 800B of dice in the stack in accordance with an example embodiment. The decoder circuits 800B may retain ID information similar to the counters of FIG. 4A. The decoder circuits 800B may be communicatively coupled to the output of monitor circuit 858 and the shift register 848. The outputs from the monitor circuit 858 of FIG. 8A labeled b1, b2, through b7, and b8 and correspond with the inputs b1, b2 through b7 and b8 of the decoder circuits 800B of FIG. 8B. As depicted, in an example embodiment, each die 810 through 817 in the stack 890 has a corresponding a decoder circuit for retaining the ID information for the die. For example the decoder circuit with a retained value of "0" may correspond with the last die (e.g., die 810) of FIG. 8A, the decoder circuit with a retained value of "1" may correspond with the second to last die (e.g., die 811) of FIG. 8A and so on.

Figure 9:
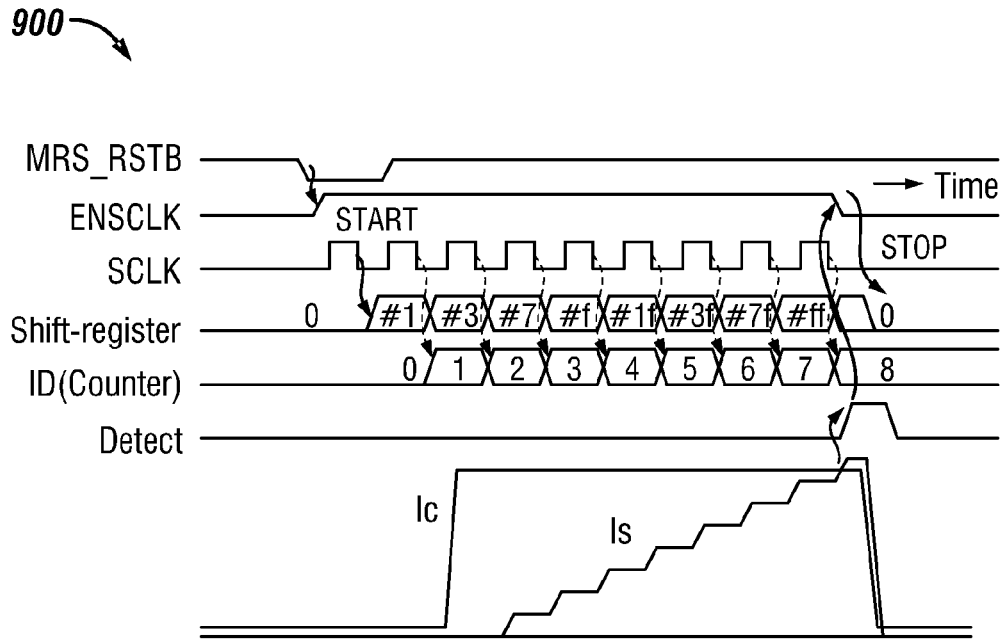
FIG. 9 illustrates a timing diagram for dice detection of the apparatus depicted in FIGS. 7 and 8A according to an example embodiment.

FIG. 9 is a timing diagram for die detection of the apparatus 700 and 800 depicted in FIGS. 7 and 8A, respectively, in accordance with an example embodiment. In FIG. 9, the signal MRS_RSTB indicates a reset bar signal generated by the Mode Register Set command (MRS), which sets the mode of the stack as an initialization mode for dice detection. The signal ENSCLK refers to the signal produced by latch 868 upon receiving an initialization signal from the MRS_RSTB signal. Signal ENSCLK is provided to oscillator 838 to produce pulse SCLK, which may comprise a square oscillating pulse, and the inverse of signal ENSCLK is provided to clear all flip flips of shift register 848. Signal SCLK is connected to all flip flops in shift register 848. At the falling edge of the SCLK, the first flip flop in the shift register 848 is activated and set to a value of "1".

At the next falling edge of the signal SCLK, the shift register 848 shifts data by one, which activates a switch transistor 858-ST and the corresponding current transistor 858-CT of monitor circuit 858. Current comparison circuit 898 compares monitor current (Is) to reference current (Ir) to determine whether monitor current (Is) is greater than or substantially equal to reference current (Ir). If the monitor current (Is) is not greater than or substantially equal to reference current (Ir), control circuit 828 waits for another repetition of the SCLK signal, and at the falling edge, shifts data in the shift register 848 (thereby effectively incrementing a count), activates a switch transistor 858-ST and corresponding current transistor 858-CT of the monitor circuit. When monitor current (Is) is greater than or substantially equal to reference current (Ir), termination circuit 878 signals termination of the initialization period and as a result, also terminates incrementing the dice count of stack 890.

Figure 10:
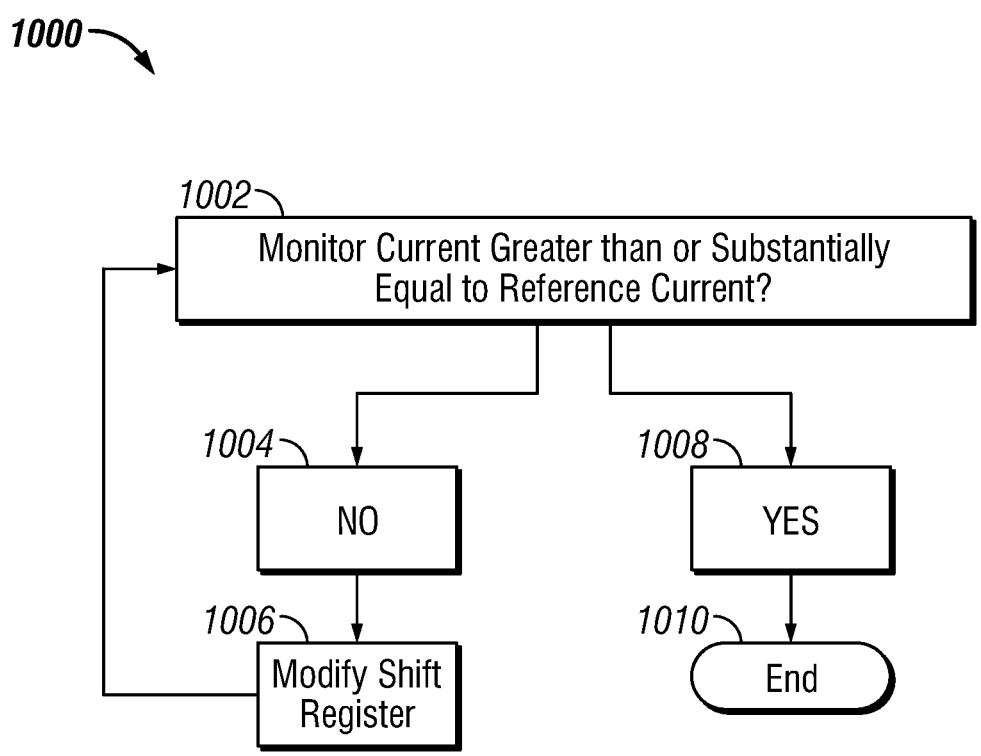
FIG. 10 illustrates a flow chart of a method of detecting dice in a stack as depicted in FIGS. 1, 2, 7 and 8A according to an example embodiment.
Figure 11:
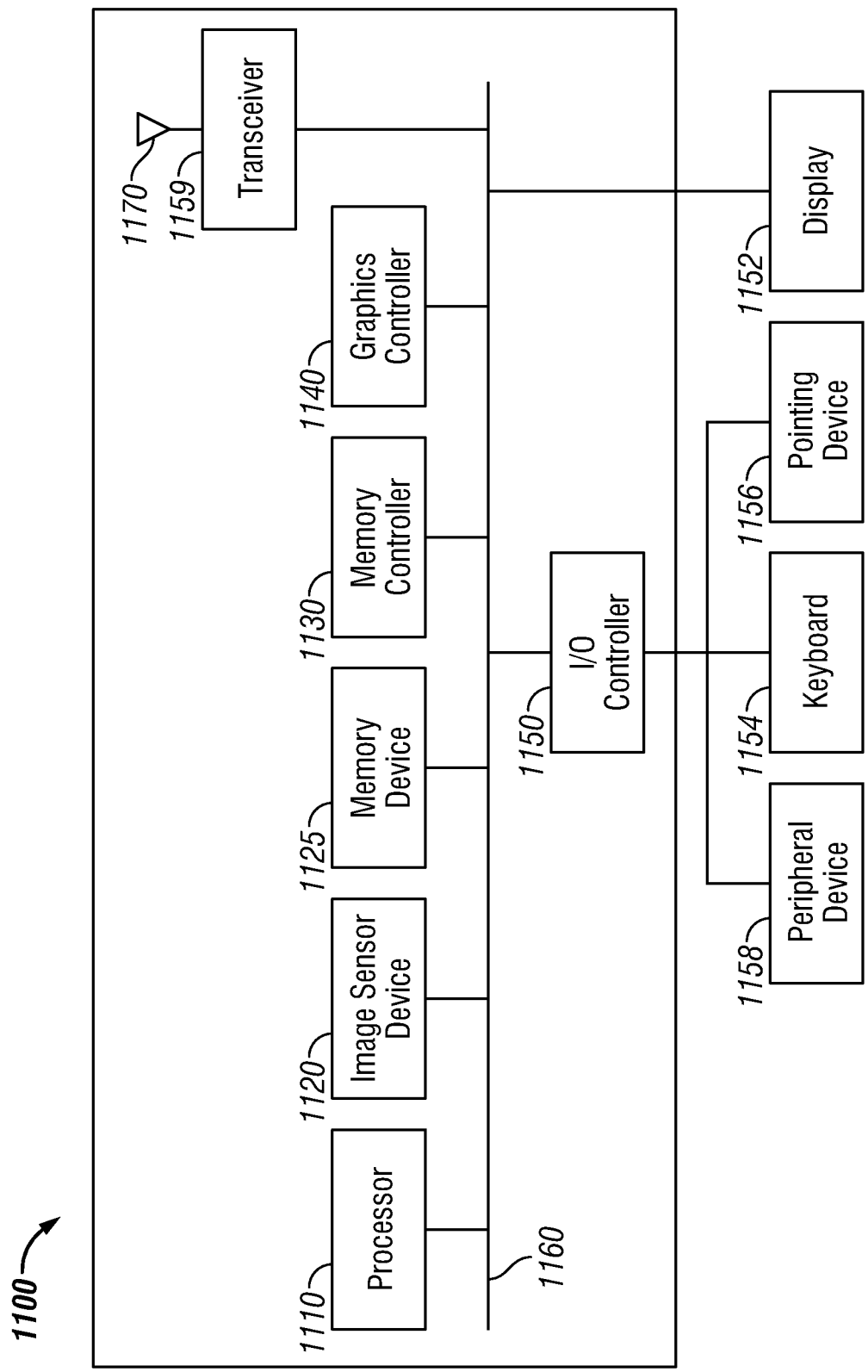
FIG. 11 illustrates a system utilizing the apparatus illustrated in FIGS. 1, 2, 3, 4A, 7, and 8A and operations according to one or more of the activities included in methods described in FIGS. 6 and 10 according to an example embodiment.

FIG. 10 illustrates a flow chart of a method 1000 of detecting dice in a stack as depicted in FIGS. 1, 2, 7 and 8A according to an example embodiment. Method 1000 may be executed when a device is powered on to initialize a dice stack and to detect and count the number of dice in the stack. Method 1000 may be used in apparatus such as apparatus 100 of FIG. 1, 200 of FIG. 2, 700 of FIG. 7, and 800 of FIG. 8A, among others. Thus, the components of apparatus used in method 1000 may include components of apparatus 100, 200, 700 and 800 depicted in FIGS. 1, 2, 7 and 8A, respectively, among others.

At block 1002, method 1000 operates to compare a monitor current across a transistor of a monitor circuit to a reference current of the dice stack at the interface die to determine whether the monitor current (determined by the number of transistors that have been switched to conduct current) is greater than or substantially equal to the reference current. At block 1004, if the monitor current is not substantially equal to or greater than the reference current, then at block 1006, method 1000 operates to increment the shift register and to switch another transistor to conduct current. In an example embodiment, the shift register may increment in order to keep count of the number of dice in the stack. At block 1002, if the monitor current is greater than or substantially equal to the reference current, then method 1000 terminates at block 1010.

FIG. 11 illustrates a system 1100 utilizing the apparatus 100, 200, 300, 400, 700, and 800 illustrated in FIGS. 1, 2, 3, 4A, 7, and 8A, and operations according to one or more of the activities included in methods 600 and 1000 of FIGS. 6 and 10 according to an example embodiment. System 1100 may include one or more of any of the following elements: a processor 1110, memory device 1125, an image sensor device 1120, a memory controller 1130, a graphics controller 1140, an input and output (I/O) controller 1150, a display 1152, a keyboard 1154, a pointing device 1156, a peripheral device 1150, and/or a system transceiver 1159. System 1100 may also include a bus 1160 to transfer information among the components of system 1100 and provide power to at least some of these components. The system 1100 may comprise one or more circuit boards 1102 where some of the components of the system 1100 may be attached, and an antenna 1170 to wirelessly transmit and receive information to and from system 1100. System transceiver 1159 may operate to transfer information from one or more of the components of system 1100 (e.g., at least one of processor 1110 and memory device 1125) to antenna 1170. System transceiver 1159 may also operate to transfer information received at antenna 1170 to at least one of the processor 1110 and at least one of memory device 1125. The information received at antenna 1170 may be transmitted to system 1100 by a source external to system 1100.

Processor 1110 may include a general-purpose processor or an application specific integrated circuit (ASIC). Processor 1110 may include a single core processor or a multiple-core processor. Processor 1110 may execute one or more programming commands to process information. The information may include digital output information provided by other components of system 1100, such as provided by image sensor device 1120 or memory device 1125.

Memory device 1125 may include a volatile memory device, a non-volatile memory device, or a combination of both. For example, memory device 1125 may include a dynamic random access memory (DRAM) device, a static random access memory (SRAM) device, a flash memory device, a phase change memory device, or a combination of these memory devices. Memory device 1125 may include one or more of the various embodiments described herein, such as apparatus 100, 200, 300, 400, 700 and 800, described above with reference to FIG. 1 through FIG. 8A.

Image sensor device 1120 may include a complementary metal-oxide-semiconductor (CMOS) image sensor having a CMOS pixel array or charge-coupled device (CCD) image sensor with a CCD pixel array.

Display 1152 may include an analog display or a digital display. Display 1152 may receive information from other components. For example, display 1152 may receive information that is processed by one or more of image sensor device 1120, memory device 1125, graphics controller 1140, and processor 1110 to display information such as text or images.

The illustrations of apparatus (e.g., apparatus 100, 200, 300, 400, 700, and 800) and systems (e.g., system 1100) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, apparatus (e.g., apparatus 100, 200, 300, 400, 700 and 800) and systems (e.g., system 1100) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., 100, 200, 300, 400, 700 and 800) and systems (e.g., system 1100), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, similar to or identical to the system 1100, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatus and methods having dice arranged in a stack. The dice may include at least a first die and a second die. The stack may include a conductive paths coupled to the dice. The conductive paths may be configured to enable detecting and counting the number of dice in the stack. The conductive paths may also be configured to enable assigning ID information to any one or more dice in the stack during an initialization period. Other embodiments including additional apparatus and methods are described above with reference to FIG. 1 through FIG. 10.

Selective structuring of connective paths in a stack of dice may thus be useful, perhaps serving to enable efficient accounting of the number of dice in a particular structure, such as a stack of dice, to increase the operational speed of elements in the stack, and to reduce the amount of space occupied by a given number of devices, or an amount of memory. Reduced production costs to achieve a given level of performance may result.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, various embodiments of the invention are determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
 a stack of dice comprising a first die having a control circuit and a monitor circuit, and a second die having an identification (ID) circuit, wherein the ID circuit of the second die is configured to determine ID information associated with the second die, and wherein the control circuit of the first die is configured to detect the second die by comparing a monitored current at the monitor circuit of the first die with a reference current determined by a resistance of the ID circuit of the second die.

2. The apparatus of claim 1, further comprising:
 a plurality of conductive paths coupled to the stack of dice, wherein at least one of the conductive paths is to couple the control circuit of the first die to the ID circuit of the second die.

3. The apparatus of claim 2, wherein the control circuit of the first die is to change memory configurations to improve memory performance in a selected die in the stack of dice during an operation.

4. The apparatus of claim 2, wherein the control circuit of the first die comprises:
 a first latch;
 a clock oscillator coupled to the latch;
 a first counter coupled to the clock oscillator; and
 a first flip flop coupled to the first counter, the first latch, and the clock oscillator.

5. The apparatus of claim 4, wherein the ID circuit of the second die comprises:
 a second counter; and
 a second flip flop coupled to the second counter.

6. The apparatus of claim 5, wherein the second counter is to receive a signal to determine the ID information associated with the second die.

7. The method of claim 5, wherein the second counter is to assign an ID to the second die.

8. The apparatus of claim 5, wherein a first conductive path of the plurality of conductive paths is to couple the second flip flop to the first flip flop, and wherein a second conductive path of the plurality of conductive paths is to couple the first counter to the second counter.

9. The apparatus of claim 1 wherein at least some of the plurality of conductive paths comprise a through-silicon-via.

10. An apparatus comprising:
 a plurality of conductive paths to couple dice in a stack, wherein a first die of the dice comprises an ID circuit to assign identification information to the first die during an initialization time period; and
 a control circuit in the first die of the dice to detect a second die of the dice by comparing a monitored current at a monitor circuit of the first die with a reference current determined by a resistance of an ID circuit of the second die.

11. The apparatus of claim 10, wherein the control circuit of the first die is to count other dice in the stack.

12. The apparatus of claim 11, wherein the first die of the dice comprises an interface die to communicate with other dice in the stack through a first set of the plurality of conductive paths, and to communicate with devices external to the dice in the stack through a second set of the plurality of conductive paths.

13. The apparatus of claim 10, wherein the ID circuit of the first die of the dice comprises:
 a first latch, a first clock oscillation circuit coupled to the first latch, a first counter coupled to the first oscillation circuit, and a first flip flop coupled to the first counter and the first latch, wherein the first counter is to count a number of other dice in the stack.

14. The apparatus of claim 13, wherein the first die of the dice is coupled to a second die of the dice by a first set of the plurality of conductive paths.

15. The apparatus of claim 14, wherein the first set of the plurality of conductive paths comprises:
 a first conductive path to supply power to the second die;
 a second conductive path to couple a second flip flop of the second die to the first flip flop of the first die; and
 a third conductive path to couple a second counter of the second die to the first counter of the first die, wherein the second flip flop is coupled to the second counter to determine ID information associated with the second die.

16. An apparatus, comprising:
 a plurality of dice in a stack, wherein a first die in the stack comprises a control circuit to detect others of the dice in the stack, and wherein a second die in the stack comprises an ID circuit, wherein the control circuit of the first die is configured to detect the second die of the other dice by comparing a monitored current at a monitor circuit of the first die with a reference current determined by a resistance of the ID circuit of the second die; and a plurality of conductive paths, wherein a first conductive path and a second conductive path in the plurality of conductive paths are to connect the first die and the second die in the stack, and wherein the ID circuit of the second die is coupled between the first conductive path and the second conductive path.

17. The apparatus of claim 16, wherein the first conductive path and the second conductive path in the plurality of conductive paths are substantially parallel to each other.

18. The apparatus of claim 16, wherein the control circuit of the first die further comprises:

a latch, a clock oscillator coupled to the latch, a shift register coupled to the clock oscillator and the latch, a monitor circuit coupled to the shift register, and a current comparison circuit coupled to the monitor circuit and the first conductive path.

19. The apparatus of claim 18, wherein the shift register is to switch the monitor circuit when the monitored current is less than the reference current.

* * * * *